(12) United States Patent
Chang et al.

(10) Patent No.: US 10,978,406 B2
(45) Date of Patent: Apr. 13, 2021

(54) SEMICONDUCTOR PACKAGE INCLUDING EMI SHIELDING STRUCTURE AND METHOD FOR FORMING THE SAME

(71) Applicant: MEDIATEK INC., Hsin-Chu (TW)

(72) Inventors: Hung-Jen Chang, Taoyuan (TW); Jen-Chuan Chen, Taoyuan (TW); Hsueh-Te Wang, Hsinchu (TW); Wen-Sung Hsu, Zhubei (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 16/007,032

(22) Filed: Jun. 13, 2018

(65) Prior Publication Data

US 2019/0019763 A1 Jan. 17, 2019

Related U.S. Application Data

(60) Provisional application No. 62/531,912, filed on Jul. 13, 2017.

(51) Int. Cl.
*H01L 23/552* (2006.01)
*H01L 25/065* (2006.01)
(Continued)

(52) U.S. Cl.
CPC ...... *H01L 23/552* (2013.01); *H01L 21/32051* (2013.01); *H01L 21/561* (2013.01); *H01L 21/565* (2013.01); *H01L 23/3121* (2013.01); *H01L 23/3675* (2013.01); *H01L 23/5386* (2013.01); *H01L 24/97* (2013.01); *H01L 25/0655* (2013.01); *H01L 25/16* (2013.01); *H01L 21/2855* (2013.01);
(Continued)

(58) Field of Classification Search
CPC ............... H01L 23/552; H01L 23/3121; H01L 23/3675; H01L 23/5386; H01L 21/32051; H01L 21/561; H01L 21/565; H01L 24/97; H01L 21/4853; H01L 2225/06537
See application file for complete search history.

(56) References Cited

U.S. PATENT DOCUMENTS

| 8,030,750 | B2 | 10/2011 | Kim et al. |
| 8,110,902 | B2 | 2/2012 | Eun et al. |

(Continued)

FOREIGN PATENT DOCUMENTS

| CN | 101645436 A | 2/2010 |
| CN | 101728363 A | 6/2010 |

(Continued)

*Primary Examiner* — Patricia D Reddington
(74) *Attorney, Agent, or Firm* — Wolf, Greenfield & Sacks, P.C.

(57) ABSTRACT

A semiconductor package structure including an encapsulating layer, a package substrate, and a conductive shielding layer is provided. The package substrate has a device region covered by the encapsulating layer and an edge region surrounding the device region and exposed from the encapsulating layer. The package substrate includes an insulating layer and a patterned conductive layer in a level of the insulating layer. The patterned conductive layer includes conductors in and along the edge region. The edge region is partially exposed from the conductors, as viewed from a top-view perspective. The conductive shielding layer covers and surrounds the encapsulating layer and is electrically connected to the conductors.

13 Claims, 11 Drawing Sheets

(51) Int. Cl.
*H01L 25/16* (2006.01)
*H01L 21/3205* (2006.01)
*H01L 21/56* (2006.01)
*H01L 23/31* (2006.01)
*H01L 23/367* (2006.01)
*H01L 23/538* (2006.01)
*H01L 23/00* (2006.01)
*H01L 23/498* (2006.01)
*H01L 21/48* (2006.01)
*H01L 21/285* (2006.01)

(52) U.S. Cl.
CPC ........ *H01L 21/4853* (2013.01); *H01L 23/367* (2013.01); *H01L 23/49805* (2013.01); *H01L 23/5383* (2013.01); *H01L 24/16* (2013.01); *H01L 24/73* (2013.01); *H01L 24/81* (2013.01); *H01L 24/92* (2013.01); *H01L 25/165* (2013.01); *H01L 2224/16227* (2013.01); *H01L 2224/32225* (2013.01); *H01L 2224/73204* (2013.01); *H01L 2224/92125* (2013.01); *H01L 2224/97* (2013.01); *H01L 2225/06537* (2013.01); *H01L 2924/15159* (2013.01); *H01L 2924/15162* (2013.01); *H01L 2924/15192* (2013.01); *H01L 2924/15311* (2013.01); *H01L 2924/15313* (2013.01); *H01L 2924/1815* (2013.01); *H01L 2924/19041* (2013.01); *H01L 2924/19042* (2013.01); *H01L 2924/19043* (2013.01); *H01L 2924/19105* (2013.01); *H01L 2924/3025* (2013.01); *H01L 2924/3511* (2013.01); *H01L 2924/35121* (2013.01); *H01L 2924/37001* (2013.01)

(56) References Cited

U.S. PATENT DOCUMENTS

| | | | |
|---|---|---|---|
| 8,378,466 B2* | 2/2013 | Chiu | H01L 21/568 257/508 |
| 8,410,584 B2 | 4/2013 | An et al. | |
| 8,592,958 B2 | 11/2013 | Ko et al. | |
| 8,614,120 B2 | 12/2013 | Yang | |
| 2010/0032815 A1* | 2/2010 | An | H01L 23/3121 257/660 |
| 2010/0109132 A1* | 5/2010 | Ko | H05K 1/0218 257/660 |
| 2010/0207258 A1 | 8/2010 | Eun et al. | |
| 2011/0115066 A1* | 5/2011 | Kim | H01L 21/565 257/690 |
| 2011/0176279 A1* | 7/2011 | Zhao | H01L 23/4093 361/720 |

FOREIGN PATENT DOCUMENTS

| | | |
|---|---|---|
| CN | 101814484 A | 8/2010 |
| CN | 102074516 A | 5/2011 |
| CN | 103022011 A | 4/2013 |

* cited by examiner

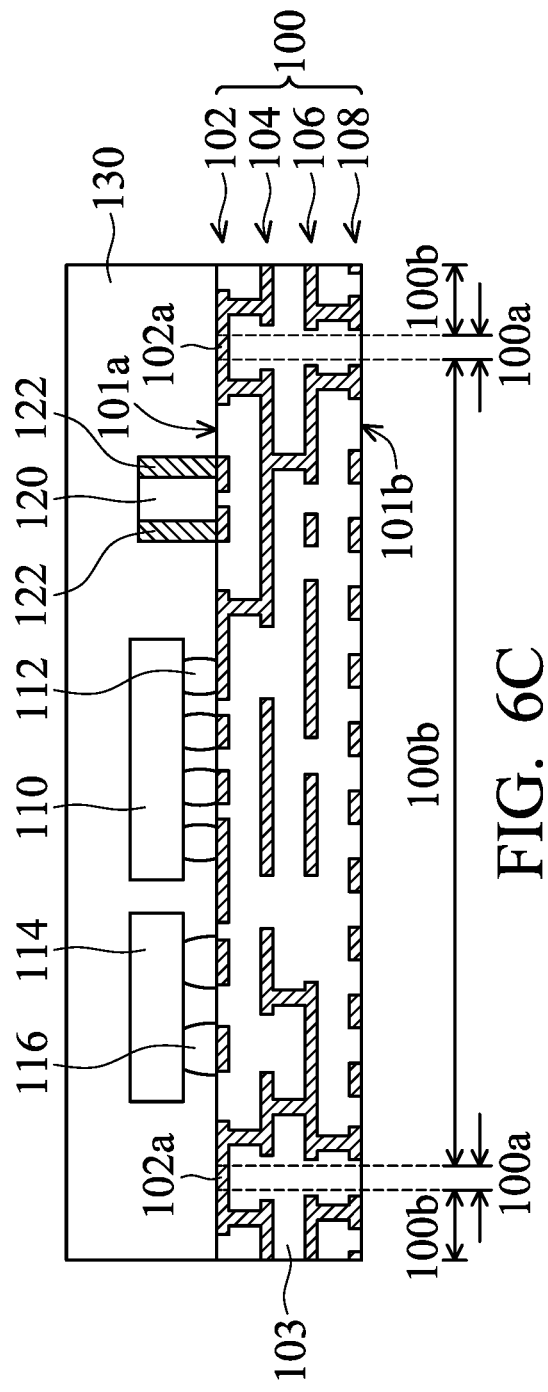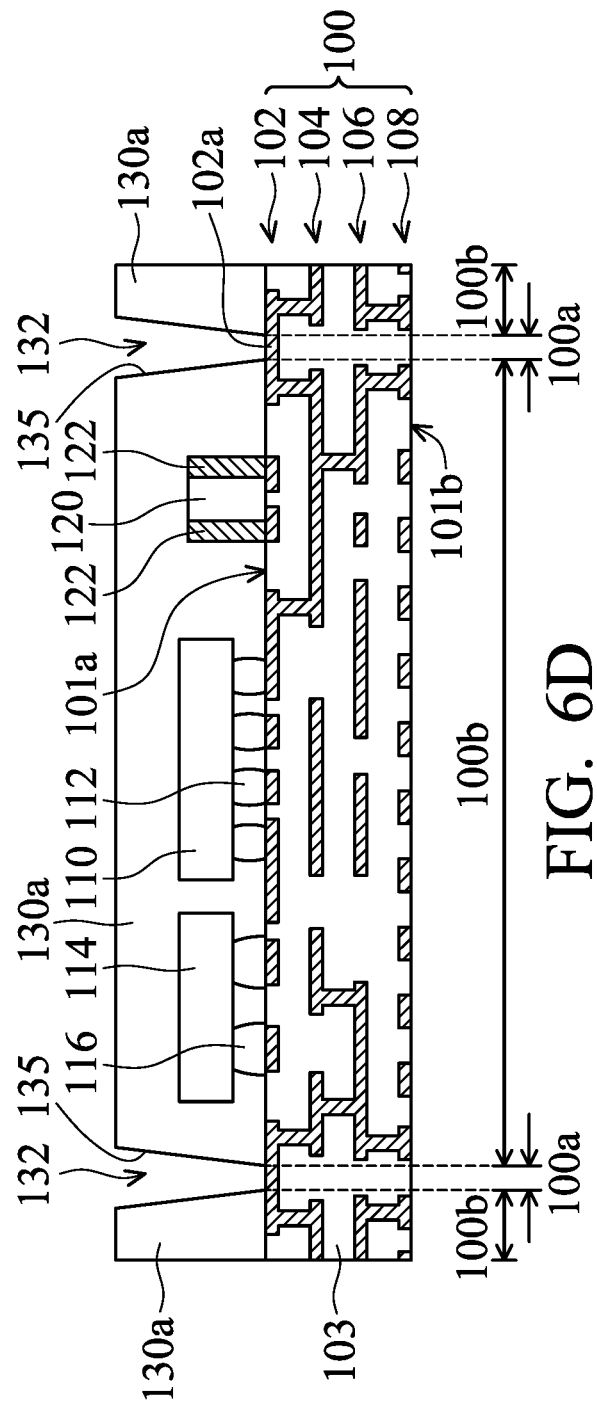

SEMICONDUCTOR PACKAGE INCLUDING EMI SHIELDING STRUCTURE AND METHOD FOR FORMING THE SAME

CROSS REFERENCE TO RELATED APPLICATIONS

This application claims the benefit of U.S. Provisional Application No. 62/531,912 filed on Jul. 13, 2017, the entirety of which is incorporated by reference herein.

BACKGROUND OF THE INVENTION

Field of the Invention

The present invention relates to a semiconductor package, and in particular to a semiconductor package that includes an EMI shielding structure.

Description of the Related Art

In order to ensure the continued miniaturization and multi-functionality of electronic products and communication devices, it is desired that semiconductor packages be small in size, support multi-pin connection, operate at high speeds, and have high functionality.

In such semiconductor packages, the integrated circuit chips incorporated therein may be subject to disturbance by electromagnetic interference (EMI). EMI may cause the semiconductor packages to exhibit abnormal operation and poor performance. To shield the semiconductor package from EMI, a metal shielding layer is embedded in an encapsulant of the semiconductor package. However, once fabrication is complicated, package thickness is increased, package warpage may occur, and the shielding layer may become delaminated when the shielding layer is embedded in the structure of the semiconductor package.

Another approach to EMI shielding is to coat a metal on the surface of the encapsulant of the semiconductor package. However, since the metal is typically formed after a singulation process, the package structure is not suitable for mass production.

Thus, a novel semiconductor package structure is desirable.

BRIEF SUMMARY OF THE INVENTION

Semiconductor package structures are provided. An exemplary embodiment of a semiconductor package structure includes an encapsulating layer and a package substrate having a device region covered by the encapsulating layer and an edge region surrounding the device region and exposed from the encapsulating layer. The package substrate includes an insulating layer and a first patterned conductive layer in a first layer-level of the insulating layer. The package substrate includes a plurality of first conductors in and along the edge region. The edge region is partially exposed from the plurality of first conductors, as viewed from a top-view perspective. A semiconductor die is disposed on the device region of the package substrate and surrounded by the encapsulating layer. A conductive shielding layer covers and surrounds the encapsulating layer and electrically connected to the plurality of first conductors.

Another exemplary embodiment of a semiconductor package structure includes an encapsulating layer and a package substrate having a device region covered by the encapsulating layer and an edge region surrounding the device region and exposed from the encapsulating layer. The package substrate includes an insulating layer and a first patterned conductive layer in a first layer-level of the insulating layer. The first patterned conductive layer includes a conductive continuous layer in and extending along the edge region. A semiconductor die is disposed on the device region of the package substrate and surrounded by the encapsulating layer. A conductive shielding layer covers and surrounds the encapsulating layer and is electrically connected to the conductive continuous layer.

An exemplary embodiment of a method for forming a semiconductor package structure includes providing a package substrate having a scribe line region and a plurality of device regions defined by the scribe line region. The package substrate includes an insulating layer and a first patterned conductive layer in a first layer-level of the insulating layer. The first patterned conductive layer includes a plurality of first conductors in and along the scribe line region. The scribe line region is partially exposed from the plurality of first conductors, as viewed from a top-view perspective. A semiconductor die is mounted onto each of the plurality of device regions of the package substrate. The package substrate is covered with an encapsulating material. An opening is formed in the encapsulating material to expose the scribe line region of the package substrate and form a plurality of encapsulating layers corresponding to the plurality of device regions. A conductive shielding layer is formed on the plurality of encapsulating layers and fills the opening, so as to be electrically connected to the plurality of first conductors.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIGS. 6A to 6E are cross-sectional views of an exemplary method for forming a semiconductor package structure in accordance with some embodiments of the disclosure.

DETAILED DESCRIPTION OF THE INVENTION

Figure 1:
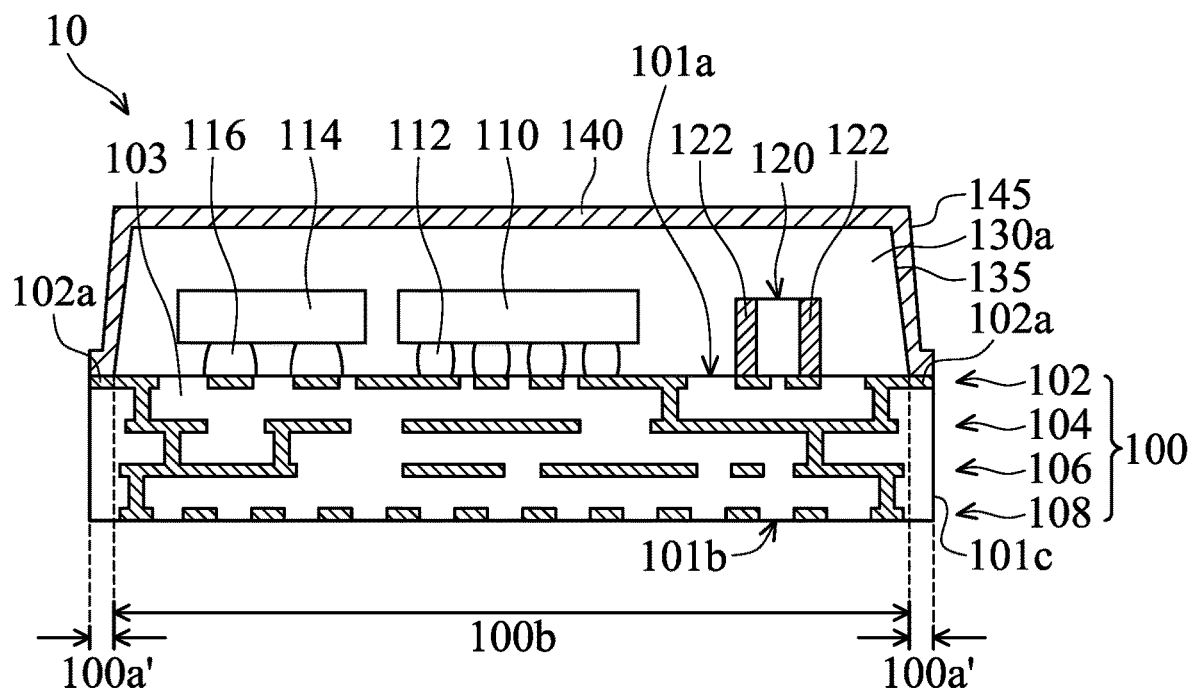
FIG. 1 is a cross-sectional view of an exemplary semiconductor package structure in accordance with some embodiments of the disclosure.

The following description is of the best-contemplated mode of carrying out the invention. This description is made for the purpose of illustrating the general principles of the invention and should not be taken in a limiting sense. The scope of the invention is determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

Figure 2A:
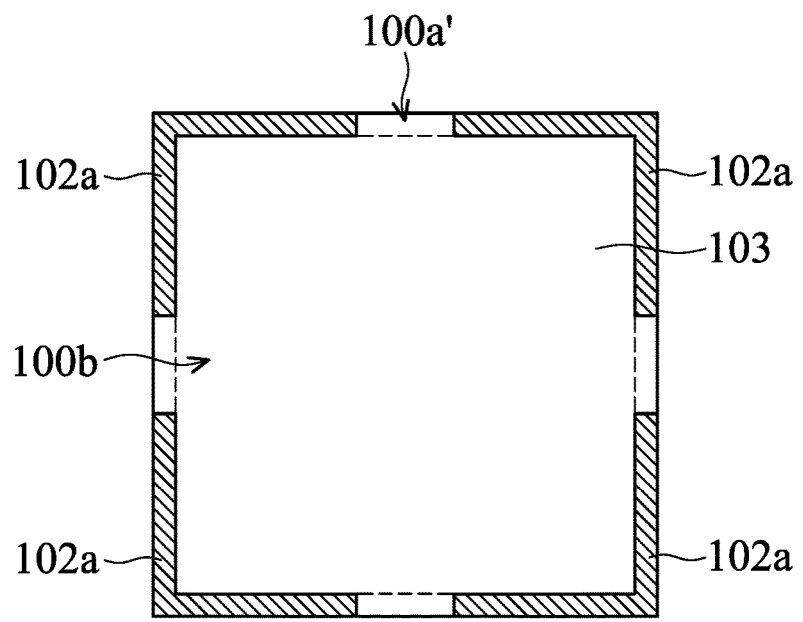
FIG. 2A is a plan view of the arrangement of first conductors in the semiconductor package structure in accordance with some embodiments of the disclosure.
Figure 2B:
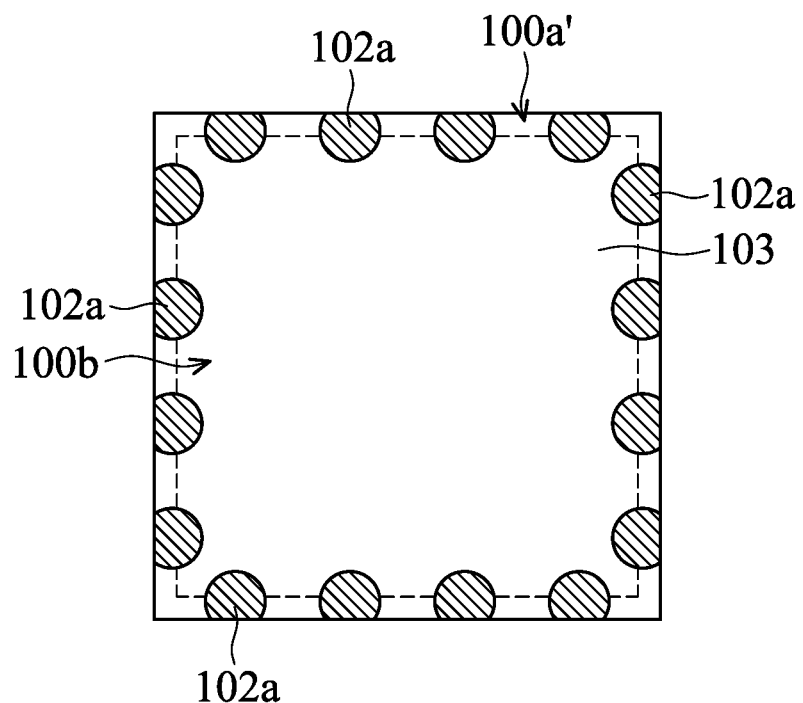
FIG. 2B is a plan view of the arrangement of first conductors in the semiconductor package structure in accordance with some embodiments of the disclosure.
Figure 2C:
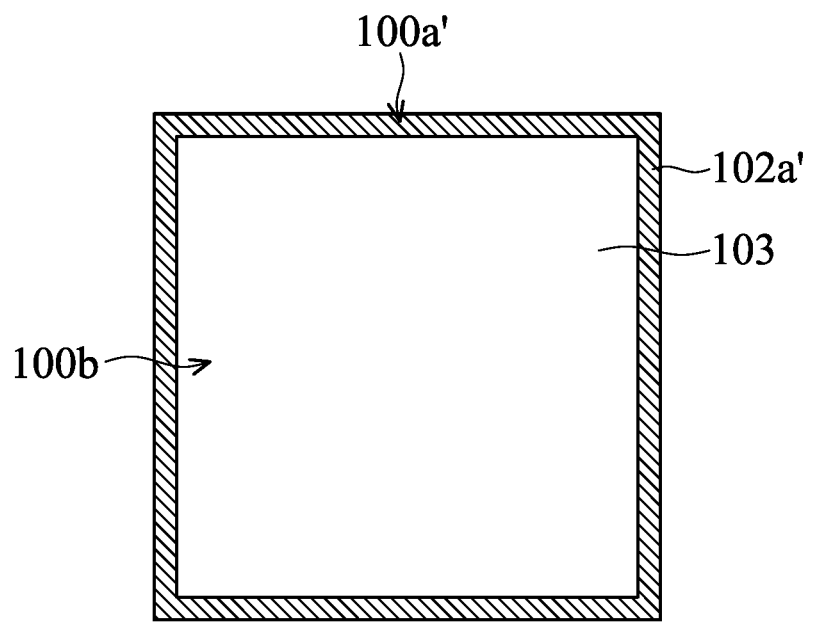
FIG. 2C is a plan view of a conductive continuous layer in the semiconductor package structure in accordance with some embodiments of the disclosure.

FIG. 1 is a cross-sectional view of an exemplary semiconductor package structure 10 in accordance with some embodiments of the disclosure. FIGS. 2A, 2B and 2C are plan views of various arrangements of first conductors in the semiconductor package structure 10 in accordance with some embodiments of the disclosure. In some embodiments, the semiconductor package structure 10 is a wafer-level semiconductor package structure, for example, a flip-chip semiconductor package structure.

Referring to FIG. 1, the semiconductor package structure 10 may be mounted on a base (not shown). In some embodiments, the semiconductor package structure 10 may include a system-on-chip (SOC) package structure. Moreover, the base may include a printed circuit board (PCB) and may be formed of polypropylene (PP). In some embodiments, the semiconductor package structure 10 is mounted on the base by a bonding process. For example, the semiconductor package structure 10 may include a conductive bump structure (not shown), such as a copper bump or a solder bump structure, a conductive pillar structure, a conductive wire structure, or a conductive paste structure that may be mounted on and electrically coupled to the base by the bonding process.

The semiconductor package structure 10 includes a package substrate 100 having a device region 100b and an edge region 100a' surrounding the device region 100b. Moreover, the package substrate 100 has a first surface 101a and a second surface 101b opposite to the first surface 101a.

In some embodiments, the package substrate 100 includes a redistribution layer (RDL) structure (which is also referred to as a fan-out structure) therein. In some embodiments, the package substrate 100 includes an insulating layer 103 (e.g., an inter-metal dielectric (IMD) layer) and one or more patterned conductive layers serving as conductive traces and disposed in the insulating layer 103. For example, a first conductive patterned layer 102 is disposed in a first layer-level of the insulating layer 103. Moreover, a second conductive patterned layer 104 is disposed in a second layer-level of the insulating layer 103 lower than the first layer-level. A third conductive patterned layer 106 is disposed in a third layer-level of the insulating layer 103 lower than the second layer-level and a fourth conductive patterned layer 108 is disposed in a fourth layer-level of the insulating layer 103 lower than the third layer-level. Those conductive patterned layer may be formed of metal. In some embodiments, the insulating layer 103 (i.e., the IMD layer) may include sub-dielectric layers successively stacked from the second surface 101b of the package substrate 100 toward the first surface 101a of the package substrate 100. In some embodiments, the insulating layer 103 may be formed of organic materials, which include a polymer base material, non-organic materials, which include silicon nitride ($SiN_x$), silicon oxide ($SiO_x$), or the like. For example, those sub-dielectric layers are made of a polymer base material. In some embodiments, the insulating layer 103 is a high-k dielectric layer (k is the dielectric constant of the dielectric layer). It should be noted that the number of patterned conductive layers and the number of sub-dielectric layers of the package substrate 100 shown in FIG. 1 is only an example and is not a limitation to the present invention.

In some embodiments, the first patterned conductive patterned layer 102 is in the uppermost layer-level of the insulating layer 103 and adjacent to the first surface 101a, so that the first patterned conductive patterned layer 102 has a top surface that is substantially level with the first surface 101a. The first patterned conductive patterned layer 102 may include a plurality of first conductors 102a disposed in and along the edge region 100a' of the package substrate 100. Moreover, the edge region 100a' is partially exposed from the plurality of first conductors 102a, as viewed from a top-view perspective.

For example, as shown in 2A, the first conductors 102a are L-shaped metal layers that are arranged at corners of the edge region 100a' and spaced apart from each other. Alternatively, the first conductors 102a spaced apart from each other are bar-shaped metal layers that are arranged at four sides of the edge region 100a' and the edge region 100a' corresponding to corners of the device region 100b are exposed from the bar-shaped metal layers, as viewed from a top-view perspective.

In some embodiments, as shown in FIG. 2B, the first conductors 102a of the first patterned conductive layer 102 are metal vias that are spaced apart from each other and the edge region 100a' corresponding to corners of the device region 100b are exposed from the metal vias (i.e., the first conductors 102a), as viewed from a top-view perspective.

In some embodiments, as shown in FIG. 2C, the first patterned conductive patterned layer 102 in the uppermost layer-level of the insulating layer 103 and adjacent to the first surface 101a includes a conductive continuous layer 102a' (e.g., a metal ring) in and extending along the edge region 100a', so as to surround the device region 100b without exposing the edge region 100a' corresponding to corners of the device region 100b, as viewed from a top-view perspective.

In some embodiments, the semiconductor package structure 10 further includes one or more semiconductor devices mounted onto the first surface 101a of the package substrate 100 and corresponding to the device region 100b of the package substrate 100. In some embodiments, the semiconductor devices may include semiconductor dies 110 and 114 that are disposed on the first surface 101 of the package substrate 100. In some embodiments, the semiconductor die 110 or 114 may include a microcontroller (MCU), a microprocessor (MPU), a random access memory (RAM), a base-band device, an artificial intelligence processing unit (APU), a power management integrated circuit (PMIC), a flash memory, a global positioning system (GPS) device, or a radio frequency (RF) device or any combination thereof. In some embodiments, at least one of the semiconductor dies 110 and 114 is a SOC die. For example, the semiconductor dies 110 and 114 are SOC dies. Alternatively, the semiconductor die 110 is a SOC die, and the semiconductor die 114 is a memory die. In some other embodiments, the semiconductor die 110 is a SOC die, and the semiconductor die 114 is a base-band die. However, the number and the arrangement of semiconductor dies are not limited to the disclosed embodiment.

In some embodiments, the semiconductor dies 110 and 114 are electrically connected to the package substrate 100. As shown in FIG. 1, the semiconductor dies 110 and 114 are fabricated by flip-chip technology. The semiconductor dies 110 and 114 includes pads (not shown) are in contact with the corresponding conductive structures 112 and 116 (for example, conductive bumps, posts or solder pastes), respectively. It should be noted that the number of semiconductor dies integrated in the semiconductor package structure 10 is not limited to that disclosed in the embodiment. The pads of the semiconductor dies 110 and 114 are mounted onto the first patterned conductive layer 102 of the package substrate 100 via conductive structures 110 and 116, respectively.

In some embodiments, the semiconductor package structure 10 further includes one or more electronic components 120 mounted onto the first surface 101a of the package substrate 100 and corresponding to the device region 100b of the package substrate 100. In some embodiments, the electronic component 120 may include a passive device that is electrically coupled to the semiconductor die 110 or 114 through the conductive traces of the package substrate 100. In some embodiments, the passive device includes a capacitor, an inductor, a resistor, or a combination thereof. Moreover, the passive device includes at least one electrode 122 electrically coupled to the first conductive patterned layer 102. For example, the passive device may be a capacitor that includes electrode layers 122 respectively electrically coupled to the semiconductor die 110 through the first patterned conductive layer 102 of the package substrate 100.

In some embodiments, the semiconductor package structure 10 further includes an encapsulating layer 130a, covering the first surface 101a of the package substrate 100, corresponding to the device region 100b of the package substrate 100, and surrounding the semiconductor dies 110 and 114 and the electronic component 120. In some embodiments, the encapsulating layer 130a may be formed of a molding compound layer, such as an epoxy, a resin, a moldable polymer, or the like. In some embodiments, an optional underfill material (not shown) is disposed in the gaps between the conductive structures 112 and 116 and surrounded by the encapsulating layer 130a.

In some embodiments, the semiconductor package structure 10 further includes a conductive shielding layer 140, such as a metal layer, covering and surrounding the encapsulating layer 130a and electrically connected to the first conductors 102a shown in FIGS. 1, 2A and 2B (or the conductive continuous layer 102a, as shown in FIG. 2C), so as to serve as an EMI shielding layer. In such cases, the first conductors 102a or the conductive continuous layer 102a are connected to ground and have a top surface in direct contact with the conductive shielding layer 140. In some embodiments, the top surface of the first conductors 102a or of the conductive continuous layer 102a is substantially level with the first surface 101a of the package substrate 100, so that the sidewalls 101c of the package substrate 100 are entirely exposed from the conductive shielding layer 140, as shown in FIG. 1. Namely, the sidewalls 101c of the package substrate 100 are not covered by the conductive shielding layer 140. Alternatively, the first patterned conductive layer 102 having first conductors 102a or a conductive continuous layer 102a is embedded in a layer-level of the insulating layer 103 below the first surface 101a, so that the conductive shielding layer 140 extends to and the covers the sidewalls of the package substrate 100 above the top surface of the first conductors 102a or the conductive continuous layer 102a.

In some other embodiments, the first patterned conductive layer 102 does not have the first conductors 102a or the conductive continuous layer 102a and one of the second and third patterned conductive layers 104 and 106 has conductors or a conductive continuous layer with a structure and arrangement that are similar to those of the first conductors 102a or the conductive continuous layer 102a. Similarly, the conductors or the conductive continuous layer also has a top surface in direct contact with the conductive shielding layer 140, so that the conductive shielding layer 140 extends to and the covers sidewalls of the package substrate 100 above the top surface of those conductors.

In some embodiments, the encapsulating layer 130a has tapered sidewalls 135. Moreover, portions of the conductive shielding layer 140 that surround the tapered sidewalls 135 of the encapsulating layer 130a have sidewalls 145 tiled with respect to sidewalls 101c of the package substrate 100, as shown in FIG. 1.

Figure 3:
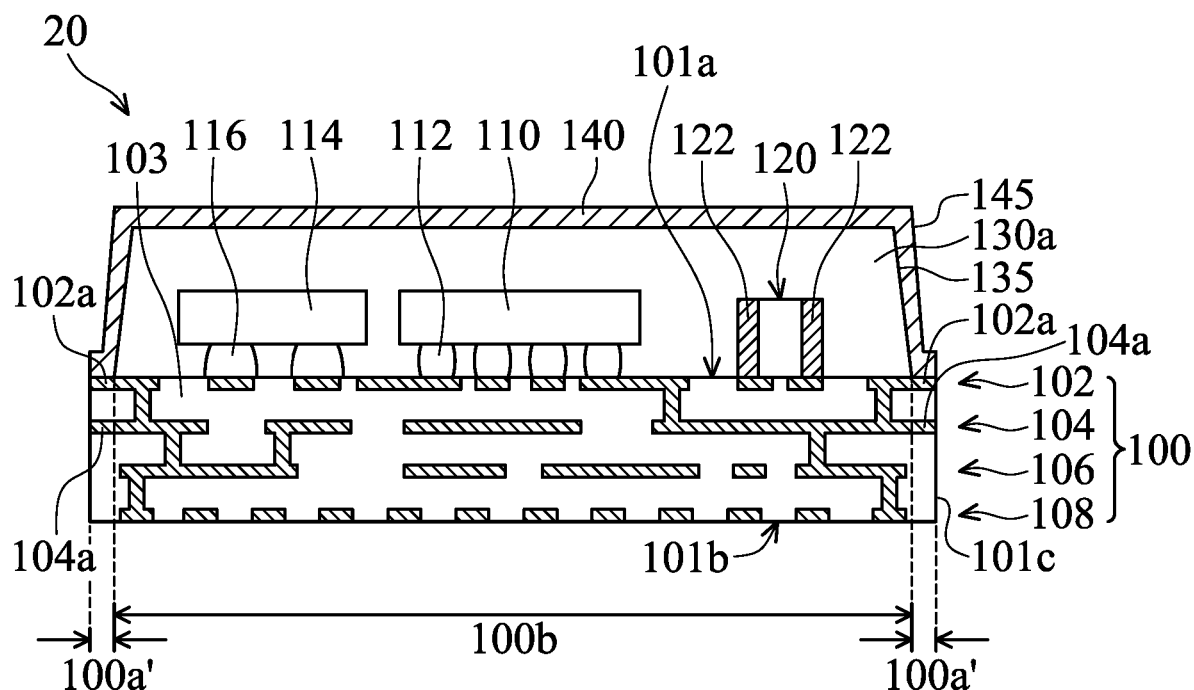
FIG. 3 is a cross-sectional view of an exemplary semiconductor package structure in accordance with some embodiments of the disclosure.
Figure 4A:
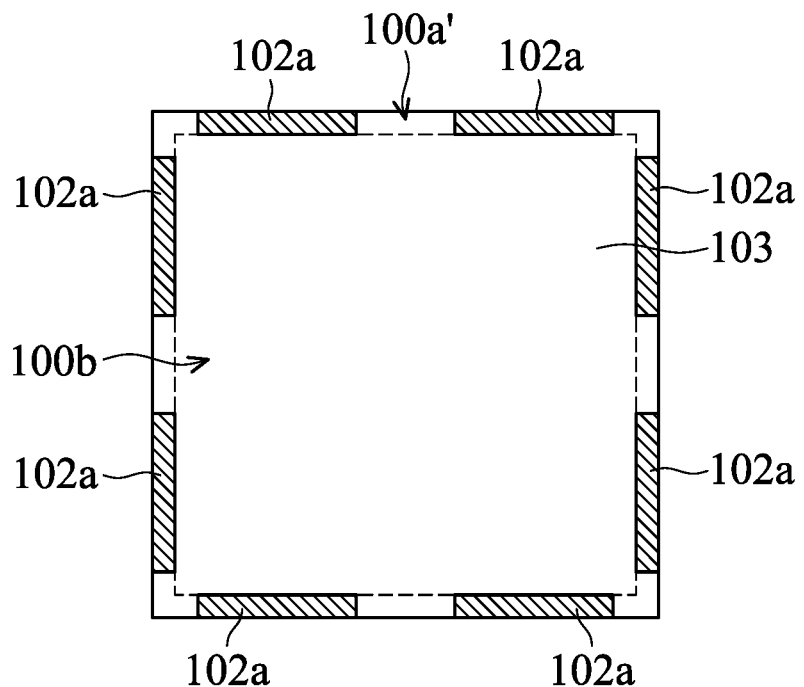
FIG. 4A is a plan view of the arrangement of first conductors in the semiconductor package structure in accordance with some embodiments of the disclosure.
Figure 4B:
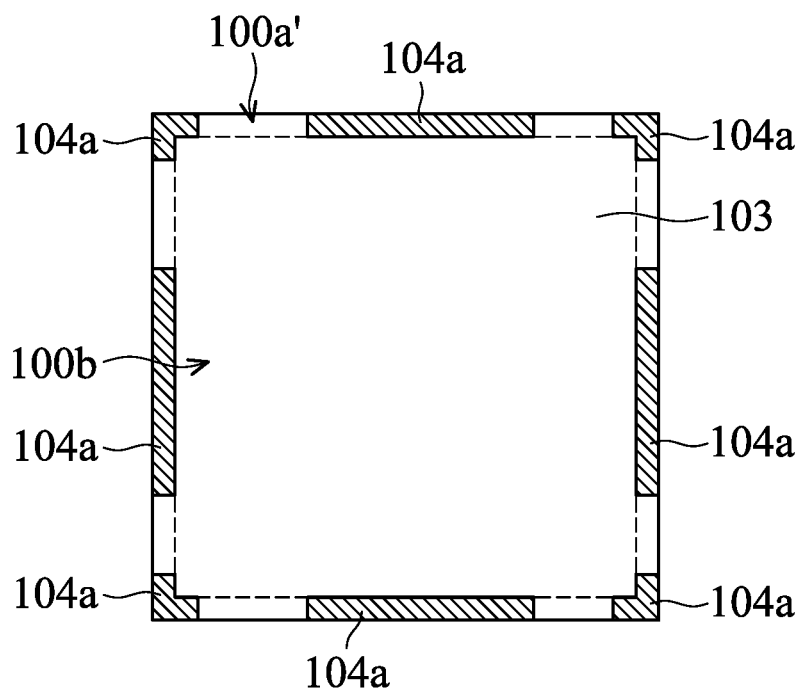
FIG. 4B is a plan view of the arrangement of second conductors in the semiconductor package structure in accordance with some embodiments of the disclosure.
Figure 5A:
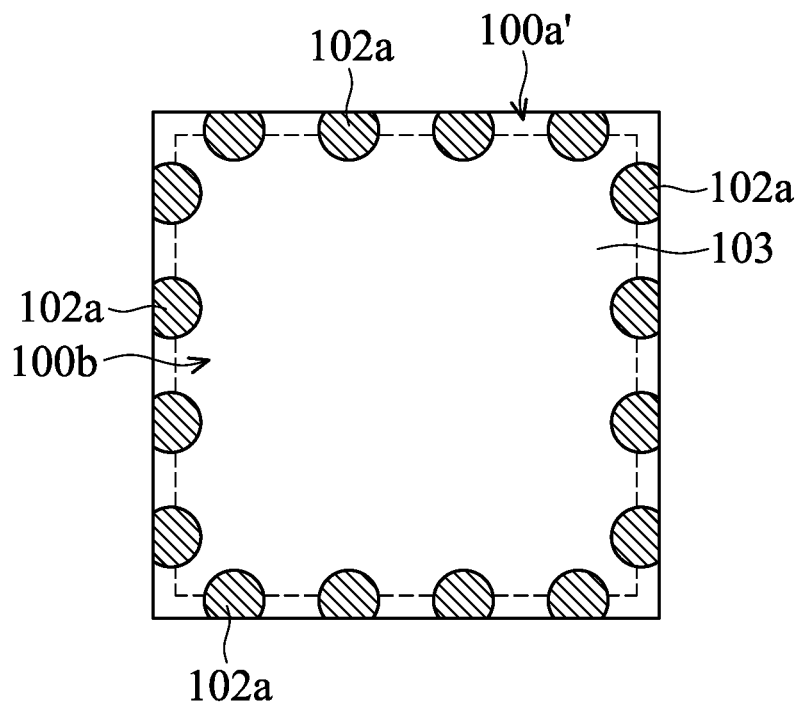
FIG. 5A is a plan view of the arrangement of first conductors in the semiconductor package structure in accordance with some embodiments of the disclosure.
Figure 5B:
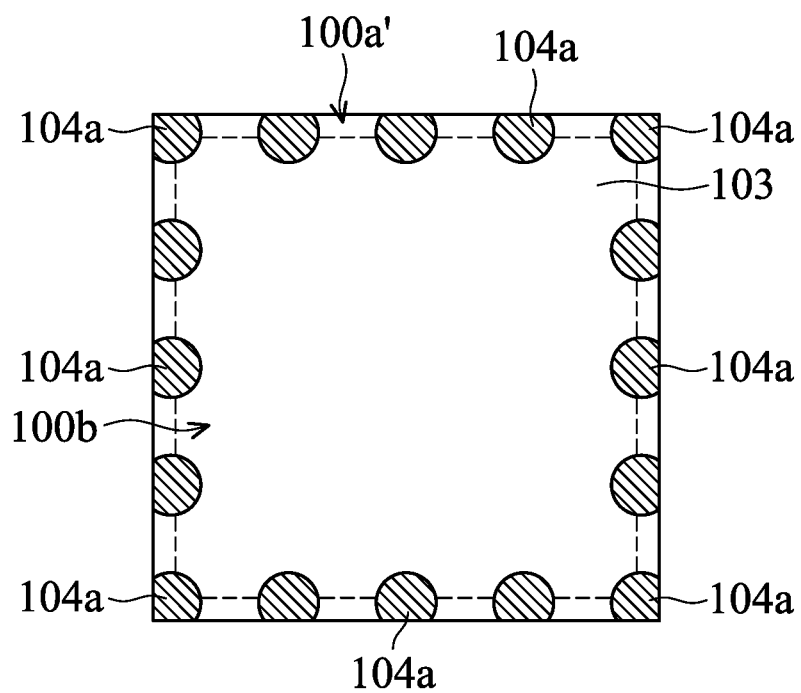
FIG. 5B is a plan view of the arrangement of second conductors in the semiconductor package structure in accordance with some embodiments of the disclosure.

FIG. 3 is a cross-sectional view of an exemplary semiconductor package structure 20 in accordance with some embodiments of the disclosure. FIGS. 4A and 4B respectively show plan views of arrangements of first conductors and second conductors in the semiconductor package structure 20 in accordance with some embodiments of the disclosure. FIGS. 5A and 5B respectively show plan views of arrangements of first conductors and second conductors in the semiconductor package structure 20 in accordance with some embodiments of the disclosure. Descriptions of elements of the embodiments hereinafter that are the same as or similar to those previously described with reference to FIGS. 1, 2A, 2B, and 2C are omitted for brevity. Referring to FIG. 3, the semiconductor package structure 20 is similar to the semiconductor package structure 10 shown in FIG. 1. Unlike the semiconductor package structure 10 shown in FIG. 1, the second patterned conductive layer 104 of the semiconductor package structure 20 includes second conductors 104a disposed in and along the edge region 100a' of the package substrate 100. Moreover, the second conductors 104a are staggered with the first conductors 102a, as viewed from a top-view perspective.

In some embodiments, as shown in FIGS. 4A and 4B, the first conductors 102a of the first patterned conductive layer 102 are bar-shaped metal layers that are spaced apart from each other and the edge region 100a' corresponding to corners of the device region 100b are exposed from the bar-shaped metal layers (i.e., the first conductors 102a), as viewed from a top-view perspective. Moreover, the second conductors 104a of the second patterned conductive layer 104 include bar-shaped and L-shaped metal layers that are spaced apart from each other and located at the edge region 100a' exposed from the first conductors 102a, as viewed from a top-view perspective. As a result, the second conductors 104a are staggered with the first conductors 102a, as viewed from a top-view perspective. It should be noted that, although the first and second conductors 102a and 104a have a staggered arrangement, the first conductors 102a may partially overlap with the second conductors 104a, as viewed from a top-view perspective.

Alternatively, the first conductors 102a are arranged the same way as the second conductors 104a shown in FIG. 4B. In this embodiment, the second conductors 104a are arranged the same way as the first conductors 102a shown in FIG. 4A.

In some other embodiments, the second patterned conductive layer 104 includes a conductive continuous layer (e.g., a metal ring) in and extending along the edge region 100a', so as to surround the device region 100b without exposing the edge region 100a' corresponding to corners of the device region 100b, as viewed from a top-view perspective. In such cases, the first conductors 102a are arranged as shown in FIG. 4A, or in the same way as the second conductors 104a shown in FIG. 4B.

In some embodiments, as shown in FIGS. 5A and 5B, the first conductors 102a of the first patterned conductive layer 102 and the second conductors 104a of the second patterned conductive layer 104 are metal vias that are spaced apart from each other. As shown in FIGS. 5A and 5B, the arrangements of the first conductors 102a and the second conductors 104a may be similar to those of the first conductors 102a and the second conductors 104a shown in FIGS. 4A and 4B, so that the second conductors 104a are staggered with the first conductors 102a, as viewed from a top-view perspective. Alternatively, the first conductors 102a are arranged the same way as the second conductors 104a shown in FIG. 5B. In this case, the second conductors 104a are arranged the same way as the first conductors 102a shown in FIG. 5A.

Although it is not shown in FIG. 3, similar to the first conductors 102a, the second conductors 104a has a top surface in direct contact with the conductive shielding layer 140, so that the conductive shielding layer 140 also covers sidewalls 101c of the package substrate 100 above the top surface of the second conductors 104a. Moreover, the first conductors 102a or the second conductors 104a may be connected to ground.

Figure 6A:
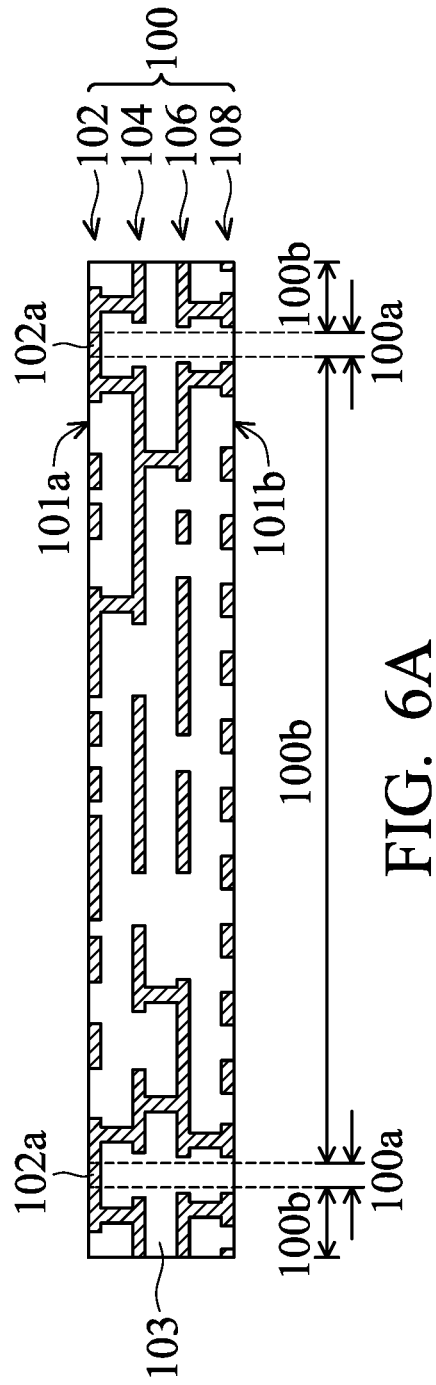

FIGS. 6A to 6E are cross-sectional views of an exemplary method for forming the semiconductor package structure 10 shown in FIG. 1, in accordance with some embodiments of the disclosure. Descriptions of elements of the embodiments hereinafter that are the same as or similar to those previously described with reference to FIGS. 1, 2A and 2B are omitted for brevity. Referring to FIG. 6A, a package substrate 100 is provided. The package substrate 100 has a first surface 101a and a second surface 101b opposite to the first surface 101a. Moreover, the package substrate 100 has a scribe line region 100a and device regions 100b defined by the scribe line region 100a, so that those device regions 100b are surrounded by the scribe line region 100a. In order to simplify the diagram, only one entire device region 100b and two adjacent and partial device regions 100b are depicted.

The package substrate 100 may include an insulating layer 103 (e.g., an inter-metal dielectric (IMD) layer). In some embodiments, a first conductive patterned layer 102, a second conductive patterned layer 104, a third conductive patterned layer 106, and a fourth conductive patterned layer 108 are respectively disposed in a first layer-level, a second layer-level, a third layer-level, and a fourth layer-level of the insulating layer 103. It should be noted that the number of patterned conductive layers shown in FIG. 6A is only an example and is not a limitation to the present invention.

The first conductive patterned layer 102 may include first conductors 102a disposed in and along the scribe line region 100a or include a conductive continuous layer (not shown) in and extending along the scribe line region 100a. The first conductors 102a may bridge the first conductive patterned layers 102 disposed in adjacent device regions 100b of the package substrate 100.

For a single device region 100b of the package substrate 100, the shape, the structure, and the arrangement of the first conductors 102a in the scribe line region 100a are the same as or similar to those of the first conductors 102a in the edge region 100a' shown in FIG. 2A or 2B. As a result, the scribe line region 100a is partially exposed from the first conductors 102a, as viewed from a top-view perspective. The exposed scribe line region 100a (e.g., the portions of the scribe line region 100a corresponding to corners of each device region 100b) may serve as a buffer region for stress release.

Also, the shape, the structure, and the arrangement of the conductive continuous layer are the same as or similar to those of the conductive continuous layer 102a' in the edge region 100a' shown in FIG. 2C.

Figure 6B:
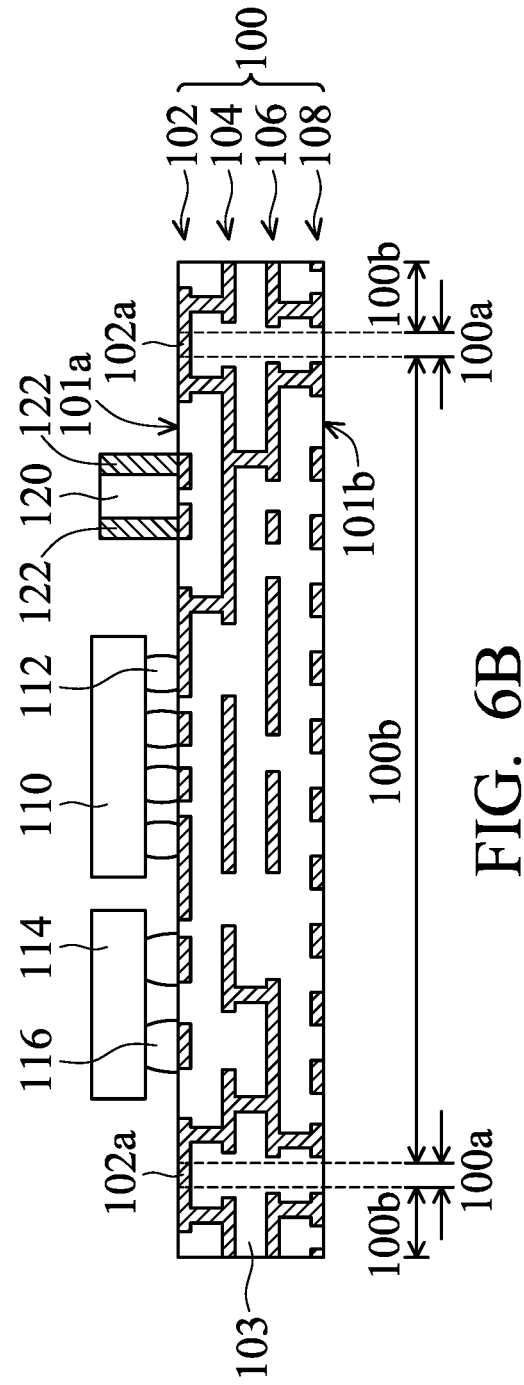

Referring to FIG. 6B, one or more semiconductor devices such as semiconductor dies 110 and 114, and one or more electronic components 120 such as passive devices are mounted onto each device region 100b of the package substrate 100 by one or more bonding processes.

Afterwards, as shown in FIG. 6C, the package substrate 100 having the semiconductor dies 110 and 114 and the electronic component 120 thereon is covered with an encapsulating material 130. In some embodiments, the encapsulating material 130 may be formed of a molding compound layer, such as an epoxy, a resin, a moldable polymer, or the like, and formed by a molded underfill (MUF) process. The encapsulating material 130 may be applied while it is substantially liquid, and then may be cured through a chemical reaction, such as in an epoxy or resin. In some other embodiments, the encapsulating material 130 may be an ultraviolet (UV) or thermally cured polymer applied as a gel or malleable solid capable of being disposed around the first semiconductor die 110, and then may be cured through a UV or thermal curing process. The encapsulating material 130 may be cured with a mold (not shown). In some embodiments, the encapsulating material 130 may be formed by a capillary underfill (CUF) process, so that an underfill material (not shown) is disposed in the gaps between the conductive structures 112 of the semiconductor die 110 and the conductive structures 116 of the semiconductor die 114 and surrounded by the encapsulating material 130.

Referring to FIG. 6D, an opening 132 is formed in the encapsulating material 130 to expose the scribe line region 100a of the package substrate 100, thereby separating the encapsulating material 130 into encapsulating layers 130a that correspond to the device regions 100b and are spaced apart from each other. In some embodiments, the opening 132 is formed by a laser ablation process, so that the formed encapsulating layer 130a has tapered sidewalls 135. After the encapsulating material 130 is formed, the opening 132 has a bottom that is substantially level with the first surface 101a of the package substrate 100 or the interface between the package substrate 100 and the encapsulating layer 130a, so that the first conductors 102a or the conductive continuous layer in the scribe line region 100a of the package substrate 100 are also exposed by the opening 132.

In some embodiments, the first patterned conductive layer 102 having first conductors 102a or a conductive continuous layer is embedded in a layer-level of the insulating layer 103 below the first surface 101a. In such cases, the opening 132 that is formed may extend into the insulating layer 103, thereby exposing the first conductors 102a or the conductive continuous layer.

Figure 6E:
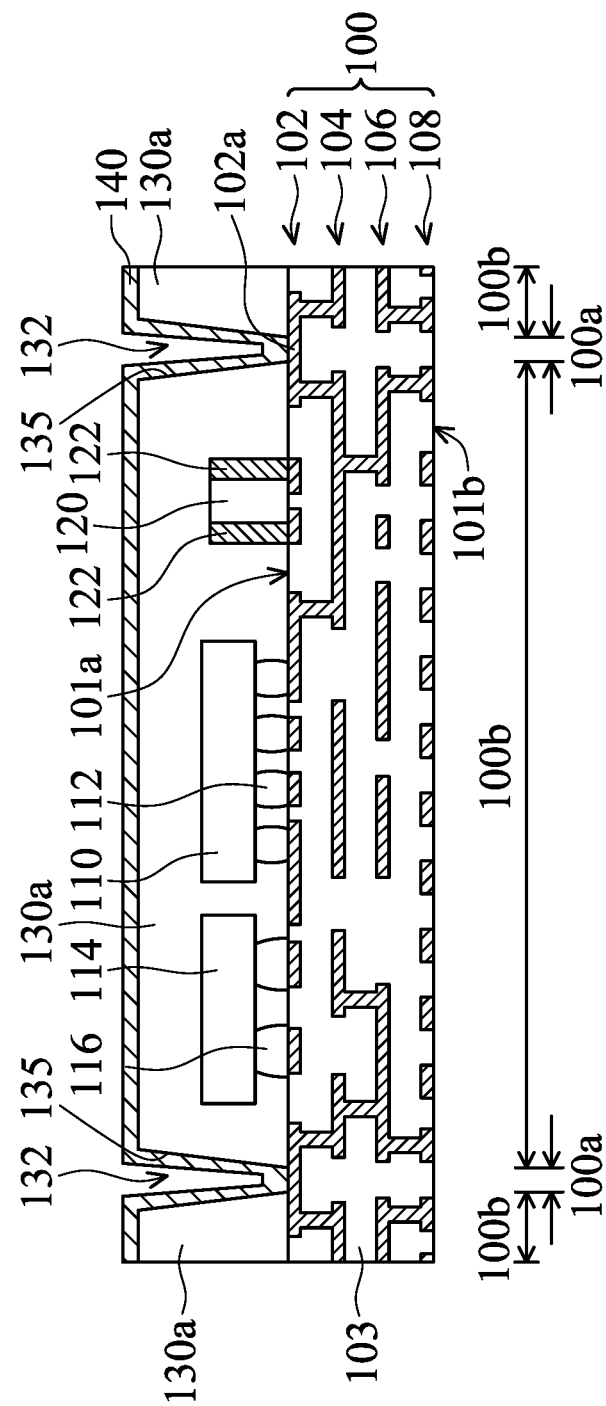

Referring to FIG. 6E, after the opening 132 is formed, a conductive shielding layer 140, such as a metal layer (e.g., copper or stainless steel), is formed on the encapsulating layers 130a and conformally fills the opening 132 by, for example, a sputtering process, so as to be electrically connected to the first conductors 102a or the conductive continuous layer exposed by the opening 132. The conductive shielding layer 140 may be in direct contact with the top surface of the first conductors 102a or the conductive continuous layer through the opening 132, so as to serve as an EMI shielding layer.

Afterwards, a singulation process is performed by cutting the scribe line region 100a of the package substrate 100 through the opening 132, so as to form semiconductor package structures 10 (as shown in FIG. 1). In some embodiments, a conductive bump structure (not shown), such as a copper bump or a solder bump structure, a conductive pillar structure, a conductive wire structure, or a conductive paste structure may be formed on the second surface 101b of the package substrate 100 prior to the singulation process.

It should be understood that the methods for forming the semiconductor package structure 20 shown in FIG. 3 can be the same as or similar to the methods shown in FIGS. 6A to 6E. In the fabrication of the semiconductor package structure 20, the second patterned conductive layer 104 in the package substrate 100 may include second conductors 104a in and along the scribe line region 100a. The second conductors 104a are staggered with the first conductors 102a, as viewed from a top-view perspective. For example, for a single device region 100b of the package substrate 100, the shape, the structure, and the arrangement of the first conductors 102a in the scribe line region 100a are the same as or similar to those of the first conductors 102a in the edge region 100a' shown in FIG. 4A and the shape, the structure, and the arrangement of the second conductors 104a in the scribe line region 100a are the same as or similar to those of the second conductors 104a in the edge region 100a' shown in FIG. 4B. As a result, the scribe line region 100a is partially exposed from the first conductors 102a, as viewed from a top-view perspective. For example, the scribe line region 100a corresponding to corners of each device region 100b is exposed from the corresponding first conductors 102a, as viewed from a top-view perspective. In some embodiments, the second conductors 104a may serve as a reflect layer or a resist layer during performing a laser ablation process that is used for forming the opening in the encapsulating material and extending into the package substrate 100, so as to expose the second conductors 104a.

Alternatively, the shape, the structure, and the arrangement of the first conductors 102a in the scribe line region 100a are the same as or similar to those of the first conductors 102a in the edge region 100a' shown in FIG. 5A and the shape, the structure, and the arrangement of the second conductors 104a in the scribe line region 100a are the same as or similar to those of the second conductors 104a in the edge region 100a' shown in FIG. 5B.

In the fabrication of the semiconductor package structure 20, the opening formed in the encapsulating material extends into the insulating layer 103, so that the second conductors 104a have a top surface that is in direct contact with the conductive shielding layer 140 through the opening.

Figure 7:
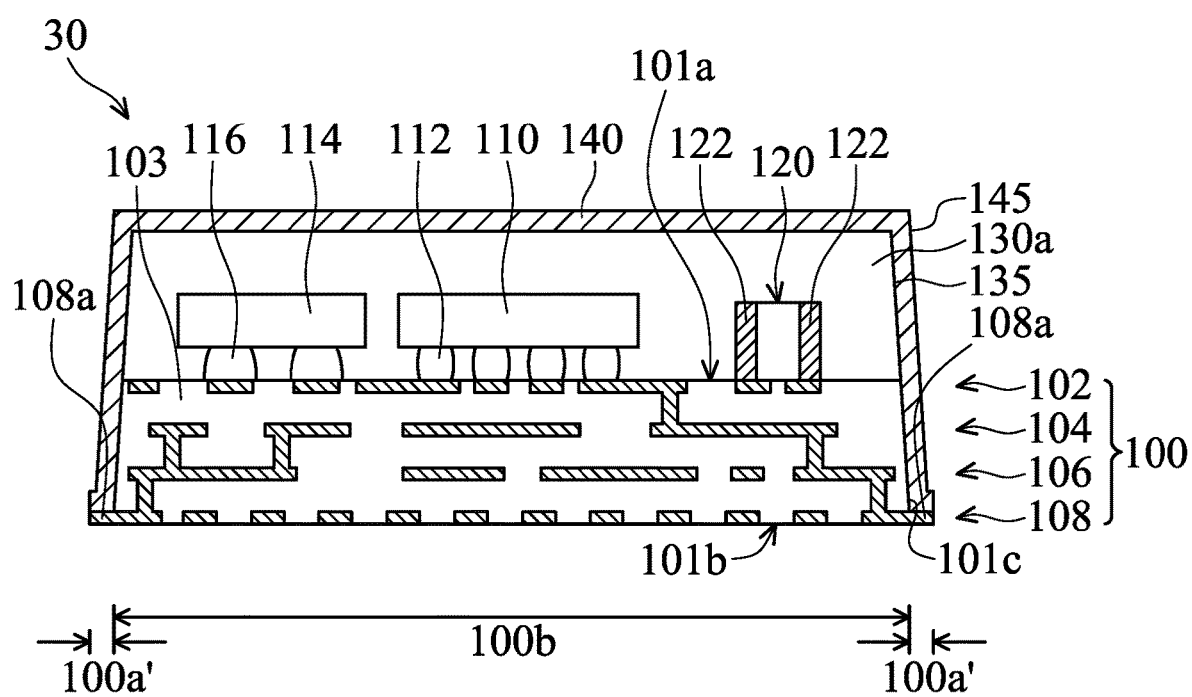
FIG. 7 is a cross-sectional view of an exemplary semiconductor package structure in accordance with some embodiments of the disclosure.

FIG. 7 is a cross-sectional view of an exemplary semiconductor package structure 30 in accordance with some embodiments of the disclosure. Descriptions of elements of the embodiments hereinafter that are the same as or similar to those previously described with reference to FIG. 1 are omitted for brevity. In the embodiment, the semiconductor package structure 30 is similar to the semiconductor package structure 10 shown in FIG. 1. The difference is the first patterned conductive layer 102 does not have the first conductors 102a. However, the fourth patterned conductive patterned layer 108 may include a plurality of fourth conductors 108a disposed in and along the edge region 100a' of the package substrate 100. The conductive shielding layer 140, such as a metal layer, covering and surrounding the encapsulating layer 130a and electrically connected to the fourth conductors 108a shown in FIG. 7 (or a conductive continuous layer 108a), so as to serve as an EMI shielding layer. In such cases, the fourth conductors 108a or the conductive continuous layer 108a are connected to ground and have a top surface in direct contact with the conductive shielding layer 140. In some embodiments, the sidewalls 101c of the package substrate 100 are entirely or partially coveted by the conductive shielding layer 140, as shown in FIG. 7.

In some embodiments, the fourth patterned conductive patterned layer 108 in the lowermost layer-level of the insulating layer 103 and adjacent to the second surface 101b. In some embodiments, the shape, the structure, and the arrangement of the fourth conductors 108a in the edge region 100a' are the same as or similar to those of the first conductors 102a in the edge region 100a' shown in FIG. 2A or 2B. As a result, the edge region 100a' is partially exposed from the plurality of fourth conductors 108a, as viewed from a top-view perspective. Alternatively, the fourth patterned conductive patterned layer 108 may include a conductive continuous layer (not shown) and the shape, the structure, and the arrangement of the conductive continuous layer in the edge region 100a' are the same as or similar to those of the second conductors 104a in the edge region 100a' shown in FIG. 2C.

It should be understood that the methods for forming the semiconductor package structure 30 shown in FIG. 7 can be the same as or similar to the methods shown in FIGS. 6A to 6E. In the fabrication of the semiconductor package structure 30, the fourth patterned conductive layer 108 in the package substrate 100 may include fourth conductors 108a or a conductive continuous layer in and along the scribe line region of the package substrate 100. In the fabrication of the semiconductor package structure 30, the opening formed in the encapsulating material extends into the insulating layer 103, so that the fourth conductors 108a has a top surface in direct contact with the conductive shielding layer 140 through the opening.

Figure 8:
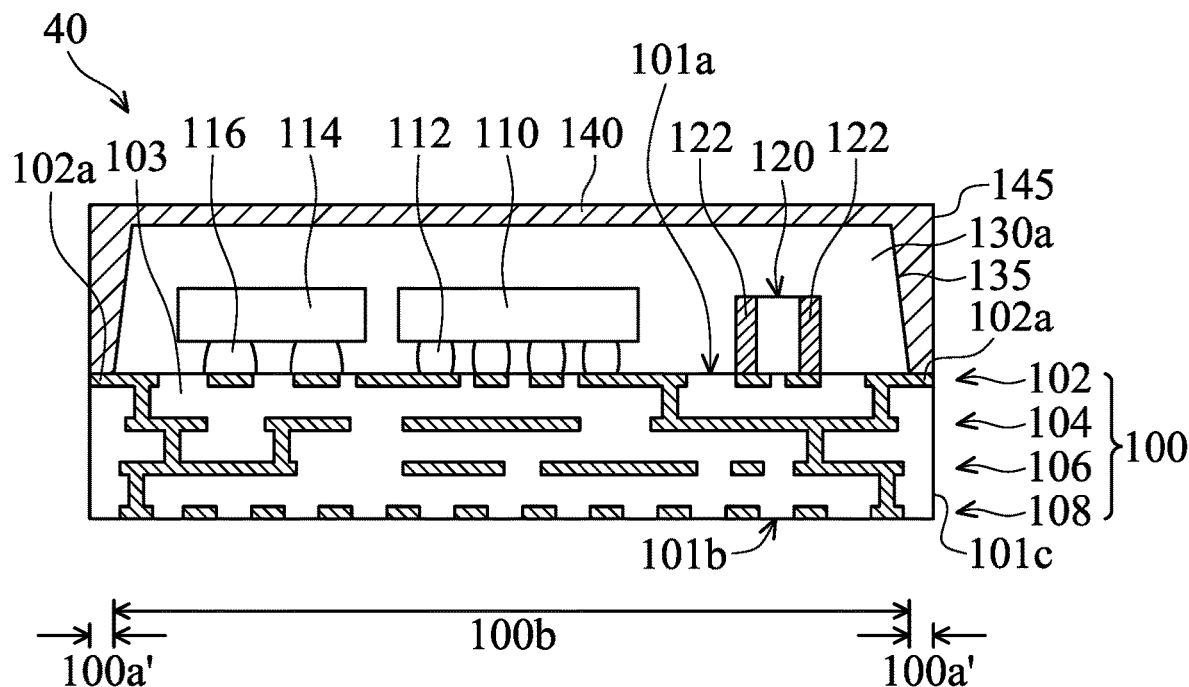
FIG. 8 is a cross-sectional view of an exemplary semiconductor package structure in accordance with some embodiments of the disclosure.

FIG. 8 is a cross-sectional view of an exemplary semiconductor package structure 40 in accordance with some embodiments of the disclosure. Descriptions of elements of the embodiments hereinafter that are the same as or similar to those previously described with reference to FIG. 1 are omitted for brevity. In the embodiment, the semiconductor package structure 40 is similar to the semiconductor package structure 10 shown in FIG. 1. The difference is portions of the conductive shielding layer 140 that surround the sidewalls 135 of the encapsulating layer 130a have sidewalls 145 that are substantially level with those of the package substrate 100.

It should be understood that the methods for forming the semiconductor package structure 40 shown in FIG. 8 can be the same as or similar to the methods shown in FIGS. 6A to 6E. In the fabrication of the semiconductor package structure 40, the opening formed in the encapsulating material 130 may be entirely filled with the conductive shielding layer 140, so that portions of the conductive shielding layer 140 that surround the sidewalls 135 of the encapsulating layer 130a have sidewalls 145 that are substantially level with those of the package substrate 100 after the singulation process has been performed. In such cases, the conductive shielding layer 140 may be formed by a plating process or a spray deposition process.

Figure 9:
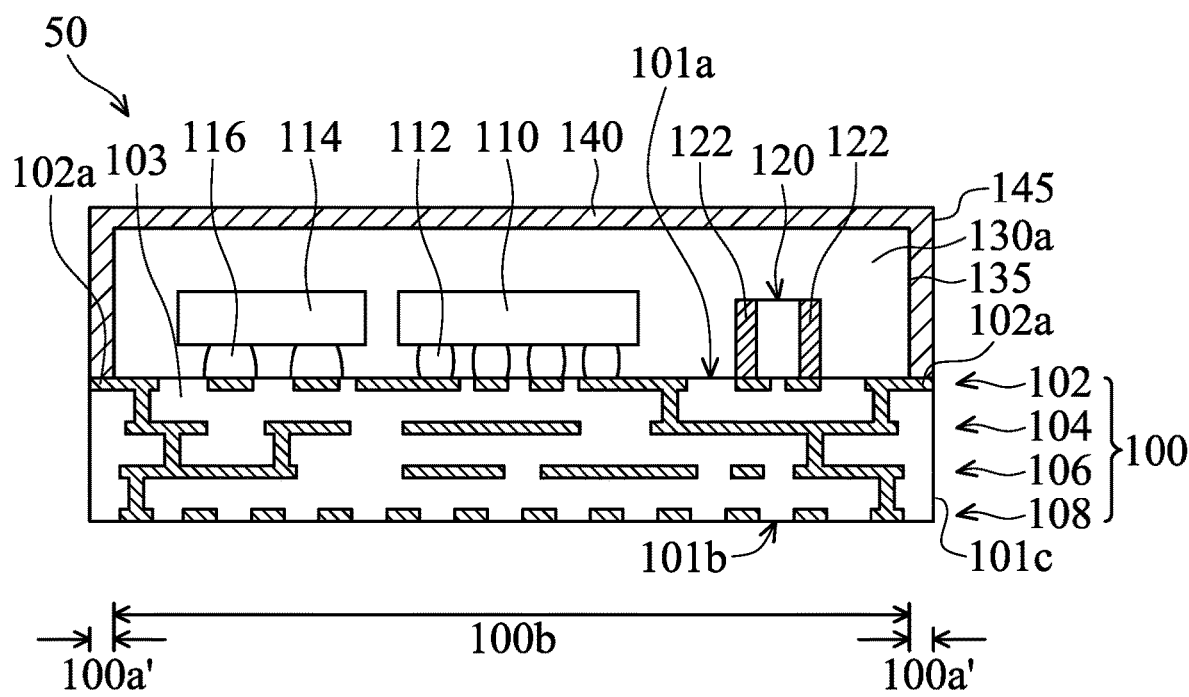
FIG. 9 is a cross-sectional view of an exemplary semiconductor package structure in accordance with some embodiments of the disclosure.

FIG. 9 is a cross-sectional view of an exemplary semiconductor package structure 50 in accordance with some embodiments of the disclosure. Descriptions of elements of the embodiments hereinafter that are the same as or similar to those previously described with reference to FIG. 8 are omitted for brevity. In the embodiment, the semiconductor package structure 50 is similar to the semiconductor package structure 40 shown in FIG. 8. The difference is the encapsulating layer 130a has sidewalls 135 that are substantially vertical.

It should be understood that the methods for forming the semiconductor package structure 50 shown in FIG. 9 can be the same as or similar to the methods shown in FIGS. 6A to 6E. In the fabrication of the semiconductor package structure 50, the opening in the encapsulating material 130 may be formed by a blade sawing process, so that the formed encapsulating layer 130a has sidewalls 135 that are substantially vertical after the singulation process has been performed. Moreover, the conductive shielding layer 140 may be formed by a plating process or a spray deposition process.

Figure 10:
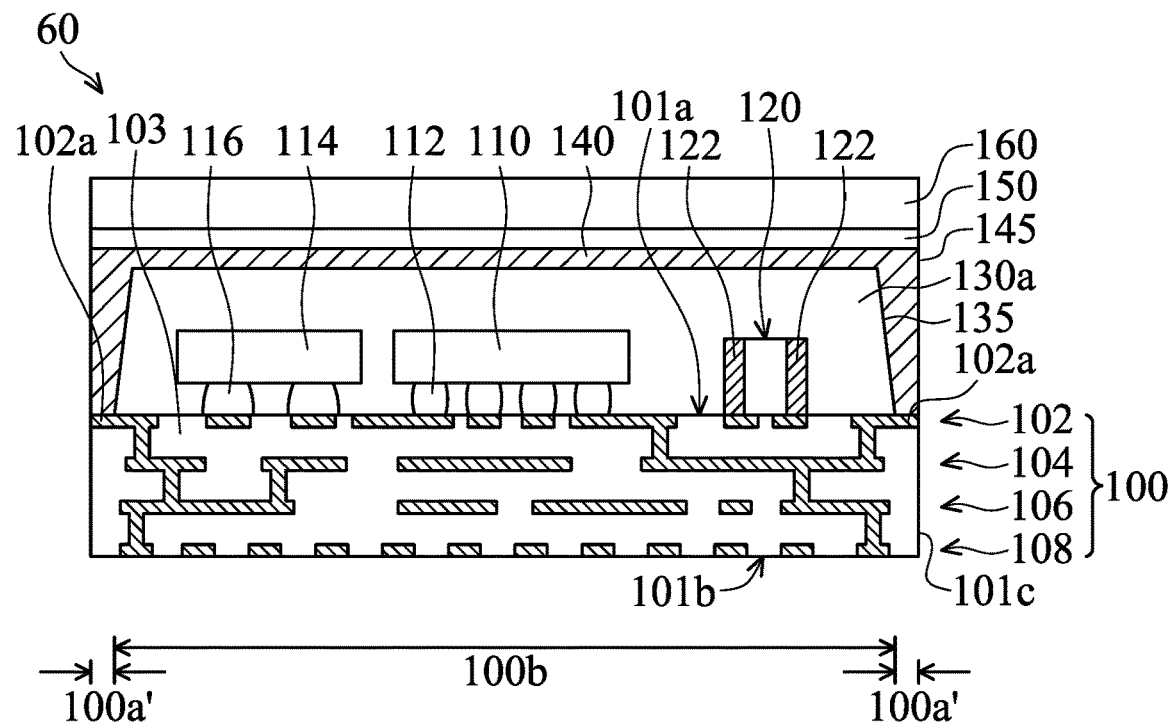
FIG. 10 is a cross-sectional view of an exemplary semiconductor package structure in accordance with some embodiments of the disclosure.

FIG. 10 is a cross-sectional view of an exemplary semiconductor package structure 60 in accordance with some embodiments of the disclosure. Descriptions of elements of the embodiments hereinafter that are the same as or similar to those previously described with reference to FIG. 8 are omitted for brevity. In the embodiment, the semiconductor package structure 60 is similar to the semiconductor package structure 40 shown in FIG. 8. The difference is the semiconductor package structure 60 further includes a heat spreader 160 over the conductive shielding layer 140. In some embodiments, the heat spreader 160 is formed over the conductive shielding layer 140 via an attached film 150.

It should be understood that the methods for forming the semiconductor package structure 60 shown in FIG. 10 can be the same as or similar to the methods shown in FIGS. 6A to 6E. In the fabrication of the semiconductor package structure 60, the attached film 150 and the heat spreader 160 are successively formed on the conductive shielding layer 140, so that the heat spreader 160 is attached onto the conductive shielding layer 140.

Figure 11:
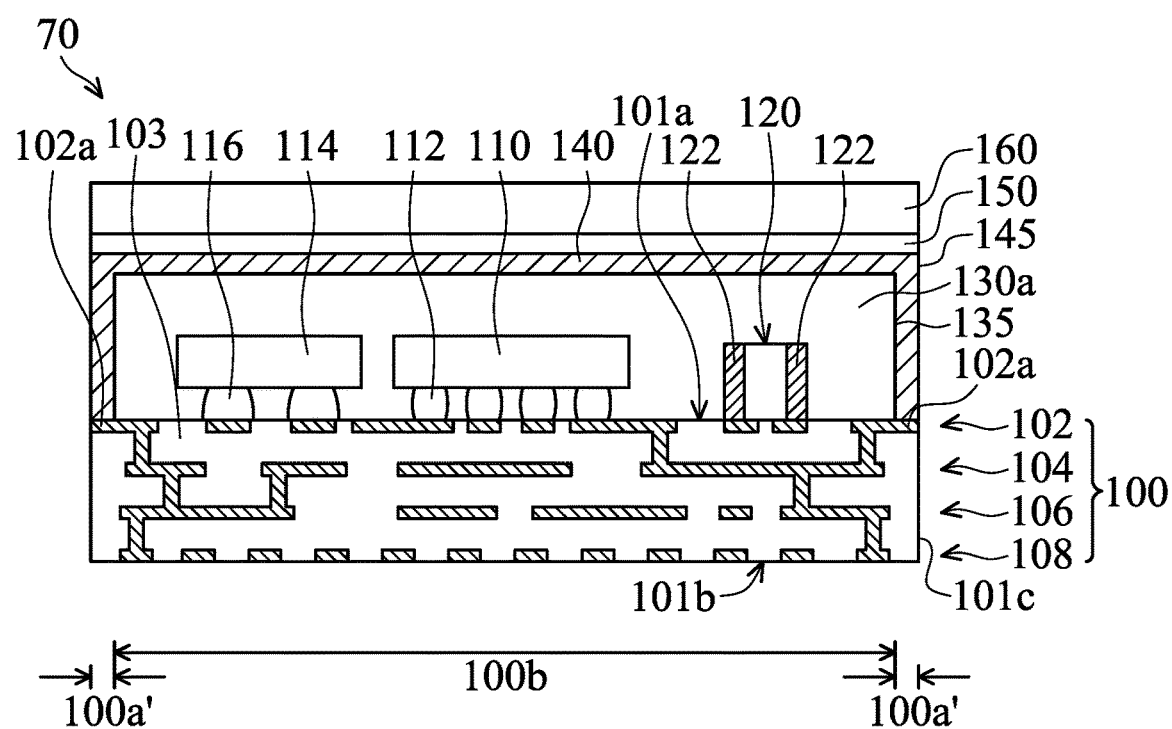
FIG. 11 is a cross-sectional view of an exemplary semiconductor package structure in accordance with some embodiments of the disclosure.

FIG. 11 is a cross-sectional view of an exemplary semiconductor package structure 70 in accordance with some embodiments of the disclosure. Descriptions of elements of the embodiments hereinafter that are the same as or similar to those previously described with reference to FIG. 9 are omitted for brevity. In the embodiment, the semiconductor package structure 70 is similar to the semiconductor package structure 50 shown in FIG. 9. The difference is the semiconductor package structure 70 further includes a heat spreader 160 over the conductive shielding layer 140. In some embodiments, the heat spreader 160 is formed over the conductive shielding layer 140 via an attached film 150.

It should be understood that the methods for forming the semiconductor package structure 70 shown in FIG. 11 can be the same as or similar to the methods shown in FIGS. 6A to 6E. In the fabrication of the semiconductor package structure 70, the attached film 150 and the heat spreader 160 are successively formed on the conductive shielding layer 140, so that the heat spreader 160 is attached onto the conductive shielding layer 140.

Moreover, it should be understood that the package substrate 100 shown in FIGS. 8, 9, 10, and 11 can be replaced by package substrate 100 shown in FIG. 3.

According to the foregoing embodiments, the semiconductor package structure is designed to fabricate an EMI shielding layer integrated into the semiconductor package (s). The EMI shielding layer provides the function of reducing electrical noise and electromagnetic radiation and a compatible process for the semiconductor package structure. Accordingly, there is no need to perform an additional process for forming the shielding device. As a result, reliability, yield, and throughput of the semiconductor package structure are increased and the manufacturing cost of the semiconductor package structure is reduced.

Additionally, the integrated EMI shielding layer can provide design flexibility for the system integration of the semiconductor package structure. Moreover, the thickness of the EMI shielding layer formed by metal sputtering, plating, or spray deposition can be reduced, thereby reducing the size of the semiconductor package structure and preventing package warpage and delamination of the EMI shielding layer.

According to the foregoing embodiments, the conductive continuous layer/the conductors formed in the scribe line region of the package substrate is/are exposed prior to the singulation process, so that the EMI shielding layer can also be formed prior to the singulation process. Since the EMI shielding layer is formed prior to the singulation process, additional tape mounting process and package rearrangement in the conventional fabrication for the EMI shielding can be omitted, thereby reducing the manufacturing cost and the process time for the semiconductor package structure and preventing pad of the package substrate from being contaminated due to the tape mounting process.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package structure, comprising:
   an encapsulating layer;
   a package substrate having a device region covered by the encapsulating layer and an edge region surrounding the device region and exposed from the encapsulating layer, the package substrate comprising:
   an insulating layer; and
   a first patterned conductive layer in a first layer-level of the insulating layer, comprising a plurality of first conductors in and along the edge region to surround the device region, wherein the edge region is partially exposed from the plurality of first conductors, as viewed from a top-view perspective;

a semiconductor die disposed on the device region of the package substrate and surrounded by the encapsulating layer; and a conductive shielding layer covering and surrounding the encapsulating layer and electrically connected to the plurality of first conductors, wherein the conductive shielding layer covers sidewalls of the package substrate above a top surface of the plurality of first conductors, wherein the first patterned conductive layer is on a bottom surface of the package substrate as viewed from a cross-sectional-view perspective.

2. The semiconductor package structure as claimed in claim 1, wherein the top surface of the plurality of first conductors is in direct contact with the conductive shielding layer.

3. The semiconductor package structure as claimed in claim 1, wherein each conductor of the plurality of first conductors is a metal via or a metal layer.

4. The semiconductor package structure as claimed in claim 1, wherein the encapsulating layer has sidewalls that are tapered.

5. The semiconductor package structure as claimed in claim 4, wherein portions of the conductive shielding layer that surround the sidewalls of the encapsulating layer have sidewalls aligned with sidewalls of the package substrate.

6. The semiconductor package structure as claimed in claim 1, further comprising a heat spreader over the conductive shielding layer.

7. The semiconductor package structure of claim 1, wherein the conductive shielding layer surrounds the package substrate.

8. A semiconductor package structure, comprising:
an encapsulating layer;
a package substrate having a device region covered by the encapsulating layer and an edge region surrounding the device region and exposed from the encapsulating layer, the package substrate comprising:
an insulating layer; and
a first patterned conductive layer in a first layer-level of the insulating layer, comprising a conductive continuous layer in and extending along the edge region to surround the device region;

a semiconductor die disposed on the device region of the package substrate and surrounded by the encapsulating layer; and a conductive shielding layer covering and surrounding the encapsulating layer and electrically connected to the conductive continuous layer, wherein the conductive shielding layer covers sidewalls of the package substrate above a top surface of the conductive continuous layer, wherein the first patterned conductive layer is on a bottom surface of the package substrate as viewed from a cross-sectional-view perspective.

9. The semiconductor package structure as claimed in claim 8, wherein the top surface of the conductive continuous layer is in direct contact with the conductive shielding layer.

10. The semiconductor package structure as claimed in claim 8, wherein the encapsulating layer has sidewalls that are tapered.

11. The semiconductor package structure as claimed in claim 10, wherein portions of the conductive shielding layer that surround the sidewalls of the encapsulating layer have aligned with sidewalls of the package substrate.

12. The semiconductor package structure as claimed in claim 8, further comprising a heat spreader over the conductive shielding layer.

13. The semiconductor package structure of claim 8, wherein the conductive shielding layer surrounds the package substrate.

* * * * *